(12) United States Patent
Yu

(10) Patent No.: US 11,585,845 B2
(45) Date of Patent: Feb. 21, 2023

(54) WAFER TESTING DEVICE OF FLIP CHIP VCSEL

(71) Applicant: Ben-Mou Yu, Taoyuan (TW)

(72) Inventor: Ben-Mou Yu, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 361 days.

(21) Appl. No.: 16/907,246

(22) Filed: Jun. 21, 2020

(65) Prior Publication Data

US 2021/0013693 A1    Jan. 14, 2021

(30) Foreign Application Priority Data

Jul. 9, 2019 (TW) ................................ 108124116

(51) Int. Cl.
*G01R 31/26* (2020.01)

(52) U.S. Cl.
CPC ..... *G01R 31/2635* (2013.01); *G01R 31/2601* (2013.01)

(58) Field of Classification Search
CPC ............ G01R 31/2635; G01R 31/2601; G01R 31/28; G01R 31/2831; G01R 1/04; G01R 1/0491; H01L 21/673; H01L 21/68714
See application file for complete search history.

(56) References Cited

U.S. PATENT DOCUMENTS

| | | | |
|---|---|---|---|
| 2002/0048826 A1* | 4/2002 | Richmond, II | G01R 31/2868 438/14 |
| 2018/0252762 A1* | 9/2018 | Jovanovic | G01R 31/2893 |
| 2020/0051877 A1* | 2/2020 | Seddon | G01R 31/2831 |

FOREIGN PATENT DOCUMENTS

CN         111103442 A  *  5/2020

* cited by examiner

*Primary Examiner* — Son T Le

(57) ABSTRACT

The invention discloses a wafer testing device of flip chip VCSEL for testing a wafer having a plurality of light emitting units. The wafer testing device of flip chip VCSEL comprises a wafer testing carrier and a flexible conductive layer. The wafer testing carrier has a first surface. A plurality of testing portions are disposed on the first surface. The flexible conductive layer, detachably disposed on the first surface, are conductive in vertical direction and insulated in horizontal direction. Wherein the wafer is disposed on the flexible conductive layer, and each light emitting unit is electrically connected with one of the testing portions in vertical direction through the flexible conductive layer while testing the wafer.

13 Claims, 11 Drawing Sheets

WAFER TESTING DEVICE OF FLIP CHIP VCSEL

CROSS REFERENCE TO RELATED APPLICATION

The present application claims priority to Taiwan patent application Serial No. 108124116 filed on Jul. 9, 2019, the entire content of which is incorporated by reference to this application.

BACKGROUND OF THE INVENTION

1. Field of the Invention

The present invention pertains to a testing device, particularly to a testing device that tests light emitting units on a wafer.

2. Description of the Prior Art

With the development of laser technology, laser diodes have been widely used in a variety of applications, such as in the application of writing or reading data, communications, light emitting, distance measurements, or sensoring different types of objects, etc. To ensure the quality of laser diodes before release, usually the laser diodes are required to light up when testing and to test whether different types of optical parameters of the laser diodes are normal. In general, the laser diodes are manufactured by semiconductor manufacturing technology. Basically, there are two types of laser diodes, which are edge-emitting laser diodes and surface-emitting laser diodes. Recently, as the structure and characteristics of the surface-emitting laser diodes meet the market needs, the production of the surface-emitting laser diodes has become the largest. Flip-chip is one of the structures of semiconductors, wherein an external circuit is manufactured on the inverted surface of an epitaxial layer, and die attach as well as electrical connection may be accomplished at the same time when packing, thereby reducing cost and time for traditional wire bonding.

In the future, the flip-chip surface-emitting laser diodes are expected to be optoelectronic units that are cheaper and widely used applications in the market. However, the manufacture of any semiconductors requires testing and screening, and the characteristics of laser diodes are highly related to temperature. Thus, different from the conventional non-flip chip laser diodes, a reliable and efficient framework for mass production of the flip-chip laser diodes has not been presented currently. Accordingly, the goal of the present invention is to provide a testing framework that is quick, efficient, highly reliable and has a temperature controlling function and low cost, thereby solving such wafer testing difficulty.

SUMMARY OF THE INVENTION

The present invention provides a wafer testing device, wherein a plurality of testing portions are disposed on a wafer testing carrier, and a plurality of light emitting units on a wafer under test may be electrically connected with said testing portions directly, such that it is not necessary to contact the light emitting surface of the wafer under test. Also, a flexible conductive layer is further disposed on the wafer testing carrier, and the flexible conductive layer is able to closely contact the surface of different types of light emitting units, which avoids electrical connecting issues caused by uneven surfaces of the light emitting units. Therefore, the wafer testing device of flip chip VCSEL in the present invention may more efficiently detect the light emitting units on the wafer under test.

The present invention discloses a wafer testing device of flip chip VCSEL for testing a wafer under test having a plurality of light emitting units. The wafer testing device of flip chip VCSEL comprises a wafer testing carrier and a flexible conductive layer. The wafer testing carrier has a first surface, wherein a plurality of testing portions are disposed on the first surface. The flexible conductive layer may be detachably disposed on the first surface and is conductive in a vertical direction and insulated in a horizontal direction. While testing the wafer under test, the wafer under test is disposed on the flexible conductive layer, and each light emitting unit is electrically connected with one of the testing portions in the vertical direction through the flexible conductive layer.

In one embodiment, each of the testing portions has a first conductive element and a second conductive element and said plurality of testing portions may be arranged according to a second matrix. In the testing portions that are in the same columns of the second matrix, the first conductive elements of the adjacent testing portions are electrically connected. In the testing portions that are in the same rows of the second matrix, the second conductive elements of the adjacent testing portions are electrically connected. In addition, each testing portion may correspond to one of the said plurality of light emitting units. The first conductive element of each testing portion is electrically connected with a first contacting pad of the corresponding light emitting unit through the flexible conductive layer, and the second conductive element of each testing portion is electrically connected with a second contacting pad of the corresponding light emitting unit through the flexible conductive layer. Moreover, the wafer testing device of flip chip VCSEL may further comprise a temperature controlling unit. The temperature controlling unit is adjacent to a second surface of the wafer testing carrier, and the second surface is opposite to the first surface. The temperature controlling unit is configured to increase or decrease the temperature of the wafer testing carrier. Furthermore, the flexible conductive layer has good thermal conductivity.

In one embodiment, the wafer testing carrier may further comprise a plurality of suction holes. Said plurality of suction holes are arranged according to a first matrix, and one end of the suction holes is exposed to the first surface. In addition, the flexible conductive layer may comprise a plurality of vias. Said plurality of vias are arranged according to the first matrix, and each via corresponds to one of the suction holes. Moreover, the wafer testing device of flip chip VCSEL may further comprise a suction module. The suction module is connected with said plurality of the suction holes and sucks gas through the suction holes according to a sucking command. Furthermore, the wafer testing device of flip chip VCSEL may further comprise a vacuum chamber and a compressing module. At least the wafer testing carrier and the flexible conductive layer are disposed in an accommodation space of the vacuum chamber, and the compressing module is configured to add pressure to the accommodation space to make the pressure in the accommodation space larger than 1 atm.

In one embodiment, the wafer testing device of flip chip VCSEL may further comprise an optical detecting module, a horizontal moving module, and a processing module. The optical detecting module may include a light receiving portion to receive a light beam and generate a detection result. The horizontal moving module may be subject to a moving command to move the wafer testing carrier and make one of the testing portions to align with the light receiving portion of the optical detecting module. The processing module may be electrically connected with the wafer testing carrier, the optical detecting module, and the horizontal moving module, to execute a detecting procedure for generating the moving command and receiving the detection result. In addition, a non-light emitting surface of the wafer under test may contact the flexible conductive layer while testing the wafer under test.

The present invention further discloses another wafer testing device of flip chip VCSEL for testing a wafer under test. The wafer under test comprises a plurality of light emitting units. The wafer testing device of flip chip VCSEL comprises a wafer testing carrier and a flexible conductive layer. The wafer testing carrier has a first surface and a plurality of suction holes. A plurality of testing portions are disposed on the first surface, and each testing portion comprises a first conductive element and a second conductive element. One end of each suction hole is exposed to the first surface. Said plurality of the testing portions are arranged according to a first pattern, and said plurality of the suction holes are arranged according to a second pattern. The flexible conductive layer may be detachably disposed on the first surface and is conductive in a vertical direction and insulated in a horizontal direction. The flexible conductive layer comprises a plurality of vias. Said plurality of the vias are arranged according to the second pattern, and each via corresponds to one of the suction holes. At least a first distance is between each suction hole and the adjacent first conductive element or the second conductive element, and at least a second distance is between each suction hole and the other adjacent suction hole, wherein the first distance is smaller than or equal to the second distance.

Based on the above, the wafer testing device of flip chip VCSEL provided in the present invention may allow massive and direct detection of dies on the wafer under test without contacting the light emitting surface of the wafer under test. Moreover, the wafer testing device of flip chip VCSEL provided in the present invention comprises the flexible conductive layer, and the light emitting units may be electrically connected with the testing portions through the flexible conductive layer, thereby overcoming issues of poor contact. Furthermore, the temperature controlling unit device provided in the present invention may allow the wafer under test on the wafer testing carrier to operate at a given temperature.

BRIEF DESCRIPTION OF THE APPENDED DRAWINGS

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1A:
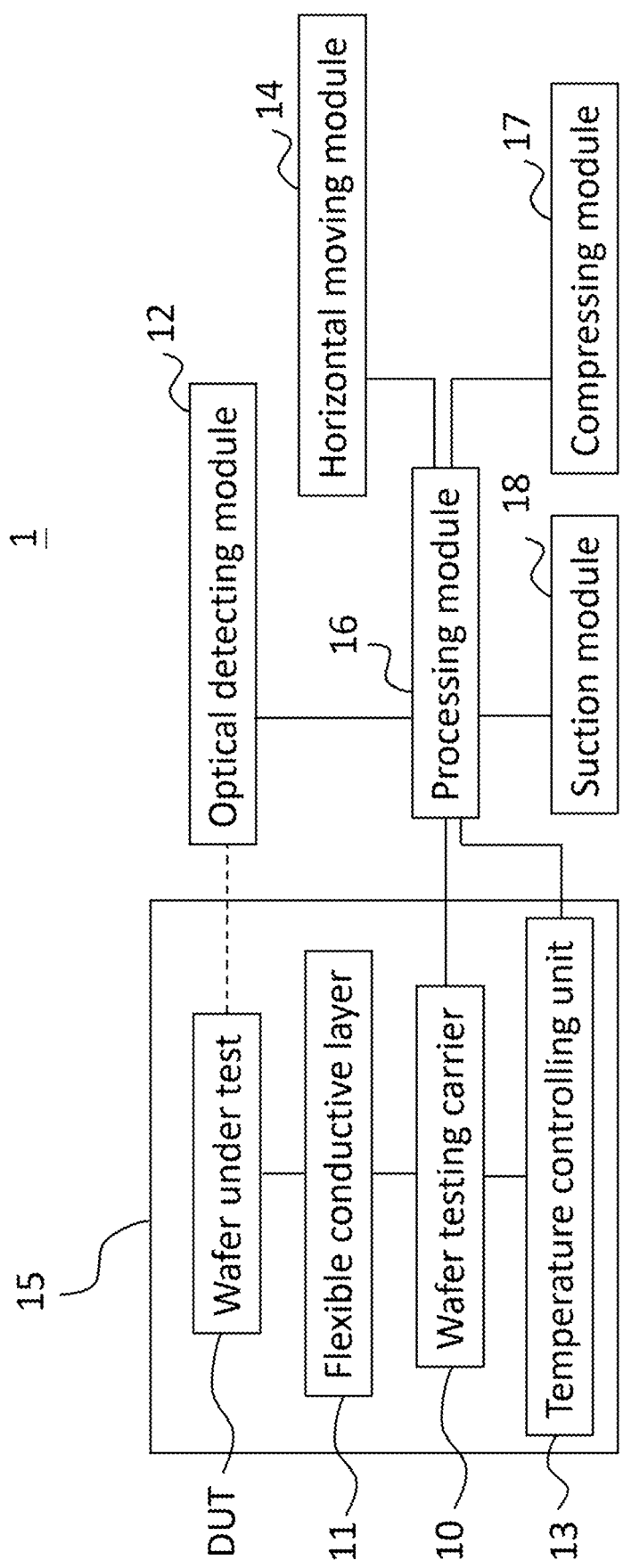
FIG. 1A is a functional block diagram of a wafer testing device of flip chip VCSEL in accordance with an embodiment of the present invention.

Please refer to FIG. 1A, a functional block diagram of a wafer testing device of flip chip VCSEL in accordance with an embodiment of the present invention. As shown in FIG. 1, a wafer testing device of flip chip VCSEL is configured to perform a test on a wafer under test DUT. The wafer under test DUT comprises a plurality of light emitting units (not shown). On the wafer under test DUT, there may be a plurality of dies without wafer dicing. Each die may be one light emitting unit or may comprise a plurality of light emitting units. Said light emitting unit may be, for example, a flip-chip type laser diode, such as a vertical cavity surface emitting laser (VCSEL). In other words, the light emitting unit in the present embodiment may emit a light beam toward a light emitting surface, wherein a side surface of the light emitting unit that is opposite to the light emitting surface may comprise a contacting pad to receive a driving signal.

Take laser diodes for an example, practically there are at least two contacting pads of the light emitting unit. Said two contacting pads may be an anode and a cathode of the laser diode respectively. In addition, the wafer under test DUT may define an upper surface and a lower surface. Said upper surface may be a light emitting surface of the light emitting unit on the wafer under test DUT. Said lower surface may be a side surface that is opposite to the light emitting surface, and the lower surface may reveal the contacting pads of each light emitting unit. A person having ordinary skill in the art shall understand the meaning of the light emitting surface; the present embodiment does not limit that the light emitting unit emits a light beam only from the light emitting surface. In one example, the light emitting unit may emit a majority of the light beam from the light emitting surface; however, the light emitting unit may also leak the light beam from side surfaces in addition to the light emitting surface, such that the light beam may be observed from the lower surface of the wafer under test DUT.

The wafer testing device of flip chip VCSEL1 may comprise a wafer testing carrier 10, a flexible conductive layer 11, an optical detecting module 12, a temperature controlling unit 13, a horizontal moving module 14, a vacuum chamber 15, a processing module 16, a compressing module 17, and a suction module 18. The processing module 16 is electrically connected with the wafer testing carrier 10, the optical detecting module 12, the temperature controlling unit 13, the horizontal moving module 14, the compressing module 17, and the suction module 18. The wafer testing carrier 10 is configured to carry the flexible conductive layer 11 and the wafer under test DUT for performing a detection procedure on the wafer under test DUT. Herein, the wafer testing carrier 10 may be disposed on a carrier stage (not shown in FIG. 1A), and a surface of one side of the wafer testing carrier 10 (i.e. a first surface) may be used to contact the flexible conductive layer 11. The flexible conductive layer 11 is not necessarily fixed on the wafer testing carrier 10. For example, the flexible conductive layer 11 may be detachably disposed on the first surface. In practice, the flexible conductive layer 11 may consist of flexible insulating materials, and a large amount metallic wires may vertically penetrate and be disposed inside said insulating materials. Therefore, the flexible conductive layer 11 may be conductive in the vertical direction, whereas be insulated in the horizontal direction. A person having ordinary skill in the art shall understand that, when the wafer under test DUT is disposed on the flexible conductive layer 11, each location of the wafer under test DUT may be electrically connected through the flexible conductive layer 11 to the corresponding location right below the wafer testing carrier 10. In addition, different from directly placing the wafer under test DUT on the first surface of the wafer testing carrier 10, the wafer under test DUT may not be closely attached to the first surface of the wafer testing carrier 10, possibly due to the rough surface of the wafer under test DUT. As the flexible conductive layer 11 in the present embodiment is not a hard material, even though the surface of the wafer under test DUT is rough, the wafer testing carrier 10 may more efficiently contact the wafer under test DUT through the flexible conductive layer 11.

When the wafer under test DUT is correctly positioned on the flexible conductive layer 11, then the wafer under test DUT is also carried by the wafer testing carrier 10, as the flexible conductive layer 11 is already disposed on the wafer testing carrier 10. The processing module 16 may drive the horizontal moving module 14 to execute an alignment and a calibration of the wafer under test DUT according to different detection areas of the wafer under test DUT. That is, the processing module 16 may be electrically connected with the horizontal moving module 14 to generate a moving command, and the horizontal moving module 14 may move the carrier stage according to the moving command and gear the wafer testing carrier 10 through the carrier stage, such that the wafer under test DUT carried on the wafer testing carrier 10 may be moved together.

In one example, if the wafer testing device of flip chip VCSEL1 is going to test a specific light emitting unit on the wafer under test DUT, the horizontal moving module 14 may need to move the carrier stage to make the carrier stage gear the wafer testing carrier 10 and the wafer under test DUT, such that the specific light emitting unit on the wafer under test DUT may be aligned to the optical detecting module 12. More preferably, the specific light emitting unit on the wafer under test DUT may be aligned to a light receiving portion (not shown) of the optical detecting module 12. Thus, after the specific light emitting unit on the wafer under test DUT is driven or lighted, the light beam emitted from said specific light emitting unit may vertically transmit into the light receiving portion, avoiding light scattering to affect detection results. In a practical example, the optical detecting module 12 may be an integrating sphere used to receive the light beam emitted from the light emitting unit on the wafer under test DUT and generate a digital detection result. Therefore, according to the detection result provided by the optical detecting module 12, the processing module 16 is able to analyze whether the light emitting unit correctly and stably emits the light beam, thereby detecting whether the light emitting unit functions normally.

On the other hand, the present embodiment does not limit the means that the horizontal moving module 14 gear the carrier stage. For example, the horizontal moving module 14 may comprise a track, and the carrier stage is fixed on the track, such that the horizontal moving module 14 may pull or push the carrier stage. As the wafer under test DUT is placed on the wafer testing carrier 10, when the horizontal moving module 14 move the carrier stage according to the moving command from the processing module 16, the wafer under test DUT surely may be moved together with the wafer testing carrier 10 and the carrier stage. In the detection procedure, the horizontal moving module 14 in the present embodiment may only need to move the carrier stage and the wafer testing carrier 10 in a horizontal direction, and may not need to move vertically, wherein said horizontal direction may generally be parallel to the light emitting surface of the wafer under test DUT. A person having ordinary skill in the art shall understand that if it is not necessary to vertically move the carrier stage and the wafer testing carrier 10, then the optical detecting module 12 may avoid steps for re-focusing or adjusting light paths.

Additionally, the wafer testing carrier 10 may be disposed on one side surface of the carrier stage, and the surface of the other side may be used to contact the temperature controlling unit 13. In other words, the temperature controlling unit 13 and the wafer under test DUT may be respectively positioned on the opposite sides of the wafer testing carrier 10; that is, the surface of the other side of the wafer testing carrier 10 (i.e. a second surface) may be close to the temperature controlling unit 13. For example, the first surface of the wafer testing carrier 10 contacts the wafer under test DUT, whereas the second surface of the wafer testing carrier 10 contacts the carrier stage. Herein, the temperature controlling unit 13 may be electrically connected with the processing module 16 and controlled by the processing module 16. Moreover, the temperature controlling unit 13 may be heated by a resistance or a heating device with an active unit, and the temperature controlling unit 13 may also be cooled down by a thermoelectric cooler. There are many ways to perform heating or cooling; for example, such heating or cooling can be performed by using liquid or gas, which are not limited in the present embodiment. A person having ordinary skill in the art may know that when the temperature controlling unit 13 is performing cooling or heating, as the temperature controlling unit 13 contacts the second surface of the wafer testing carrier 10, the temperature of the wafer testing carrier 10 may be adjusted by using thermal conductivity. Thus, the temperatures of the wafer under test DUT and the flexible conductive layer 11 which laterally contacts the first surface of the wafer testing carrier 10 may also be changed by thermal conductivity.

Practically, the temperature controlling unit 13 in the present embodiment may control the temperature of the wafer under test DUT. For example, the processing module 16 may detect the temperature of the wafer under test DUT by using a temperature detector (not shown). When the detected temperature of the wafer under test DUT is too high, the processing module 16 may activate the temperature controlling unit 13 (e.g. the thermoelectric cooler) to perform cooling. Conversely, when the detected temperature of the wafer under test DUT is too low, the processing module 16 may activate the temperature controlling unit 13 (e.g. the resistance or the heating device with an active unit) to perform heating. Said temperature detector may be disposed on the carrier stage, which is not limited in the present embodiment. Accordingly, through thermal conductivity of the temperature controlling unit 13 and the carrier stage, the wafer testing carrier 10 on the carrier stage, the flexible conductive layer 11, and the wafer under test DUT may maintain at a constant temperature. In a practical operation, it is often required to detect optoelectronic characteristics of the light emitting units on the wafer under test DUT at different temperatures, and then the processing module 16 may set the temperature controlling unit 13 to maintain at many different temperatures. For example, the processing module 16 may set the temperature controlling unit 13 to maintain the temperatures at 25° C., 50° C. or 70° C.

Figure 1B:
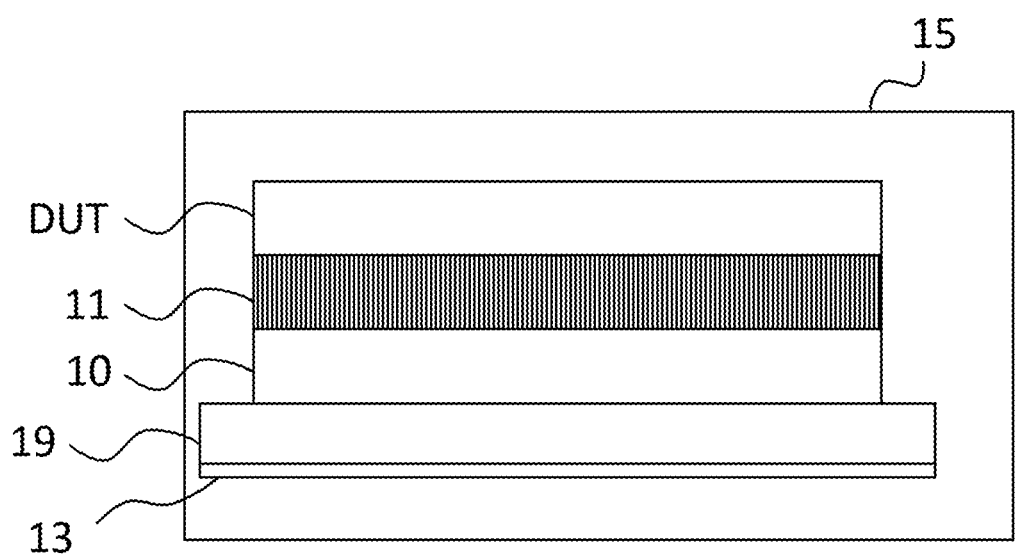
FIG. 1B is a section framework view of a wafer testing device of flip chip VCSEL in accordance with an embodiment of the present invention.

Moreover, the wafer testing device of flip chip VCSEL1 may further comprise a vacuum chamber 15, a compressing module 17, and a suction module 18. The vacuum chamber may be configured to accommodate the wafer testing carrier 10, the flexible conductive layer 11, the temperature controlling unit 13, and the wafer under test DUT. Please refer to FIG. 1A and FIG. 1B, wherein FIG. 1B is a section framework view of a wafer testing device of flip chip VCSEL in accordance with an embodiment of the present invention. As shown in FIG. 1A and FIG. 1B, the wafer testing carrier 10, the flexible conductive layer 11, the temperature controlling unit 13, the carrier stage 19, and the wafer under test DUT may be accommodated inside the vacuum chamber 15 (e.g. in an accommodation space). The compressing module 17 is used to increase the gas pressure in the accommodation space of the vacuum chamber 15. In one example, the compressing module 17 is not disposed inside the accommodation space; instead, it can be connected by gas lines to the accommodation space of the vacuum chamber 15. The suction module 18 is configured to suck air between the wafer under test DUT and the flexible conductive layer 11. More preferably, the suction module 18 sucks air between the wafer under test DUT and the flexible conductive layer 11 into nearly vacuum. Alternatively, the suction module 18 is also not disposed inside the accommodation space; instead, the suction module 18 is connected by gas lines to where between the wafer under test DUT and the flexible conductive layer 11. In one example, by coordinating among the flexible conductive layer 11, the compressing module 17 and the suction module 18, the wafer testing device of flip chip VCSEL1 may press the wafer under test DUT closely to the flexible conductive layer 11, such that the wafer testing carrier 10 may more efficiently contact the wafer under test DUT through the flexible conductive layer 11.

In a practical operating example, if there is no vacuum chamber 15, then the regular environmental pressure is around 1 atm in theory. If the suction module 18 sucks air between the wafer under test DUT and the flexible conductive layer 11 into nearly vacuum, then it is known that the pressure difference is 1 atm between the pressure outside and the pressure between the wafer under test DUT and the flexible conductive layer 11. That is, the wafer under test DUT may be subject to 1.0336 kgw/cm$^2$ pressure toward the flexible conductive layer 11. The conductive resistance of the flexible conductive layer 11 is related to the pressure, and insufficient pressure may result in too high conductive resistance that may affect the detection accuracy. Although the flexible conductive layer 11 may still be closely attached to the surface of the wafer under test DUT, under some detecting circumstances, especially under the detection with a large current, it is necessary to compress the pressure for reducing the conductive resistance to an acceptable range, thereby obtaining accurate detection results.

As stated above, if there is the vacuum chamber 15, the compressing module 17 may compress the pressure inside the vacuum chamber 15 to be higher than the environmental pressure, such as making the pressure larger than 1 atm in the accommodation space. For example, if the compressing module 17 compress the pressure inside the vacuum chamber 15 to be 5 atm, at this moment, if the suction module 18 sucks air between the wafer under test DUT and the flexible conductive layer 11 into nearly vacuum, then it is known that the pressure difference is 5 atm between the pressure outside and the pressure between the wafer under test DUT and the flexible conductive layer 11. That is, the wafer under test DUT may be subject to 5.167 kgw/cm$^2$ pressure toward the flexible conductive layer 11. Apparently, by allowing the wafer under test DUT be more closely attached to the flexible conductive layer 11, the wafer testing carrier 10 may more efficiently contact the wafer under test DUT through the flexible conductive layer 11. Practically, the degree of compressing by the compressing module 17 may be adjusted freely. For example, engineers may set different compressing commands. If the surface of wafer under test DUT is not very smooth, then the degree of compressing by the compressing module 17 may be increased according to a compressing command, so that the pressure per square centimeter toward to the wafer under test DUT may also be increased. Alternatively, if the surface of wafer under test DUT is smoother, then the degree of compressing by the compressing module 17 may be decreased according to a compressing command, so that the pressure per square centimeter toward to the wafer under test DUT may also be decreased. Certainly, the degree of compressing by the compressing module 17 is also related to the conductive resistance of the flexible conductive layer 11. A person having ordinary skill in the art may know that if the wafer under test DUT is just lightly placed on the flexible conductive layer 11, even though the wafer under test DUT is electrically connected with the flexible conductive layer 11, the conductive resistance is still relatively high between the wafer under test DUT and the flexible conductive layer 11. To decrease the conductive resistance of the flexible conductive layer 11, the compressing module 17 is supposed to add appropriate pressure to compress the wafer under test DUT on the flexible conductive layer 11.

In addition, the suction module 18 is subject to a sucking command of the processing module 16. When the suction module 18 receives the sucking command to start sucking gas, it will suck air between the wafer under test DUT and the flexible conductive layer 11 into nearly vacuum, thereby allowing the wafer under test DUT to be attached to the flexible conductive layer 11 and the wafer testing carrier 10. Accordingly, it may avoid unnecessary shift or shaking on the wafer under test DUT when the wafer testing carrier 10 is moved. In a practical example, when the wafer testing device of flip chip VCSEL1 is under the state of detection, the suction module 18 is supposed to maintain sucking gas, so as to make the wafer under test DUT firmly sucked on the flexible conductive layer 11 and the wafer testing carrier 10. Conversely, when the wafer testing device of flip chip VCSEL1 is not under the state of detection, the suction module 18 will stop sucking gas, so that engineers may replace or adjust the wafer under test DUT.

Figure 2:
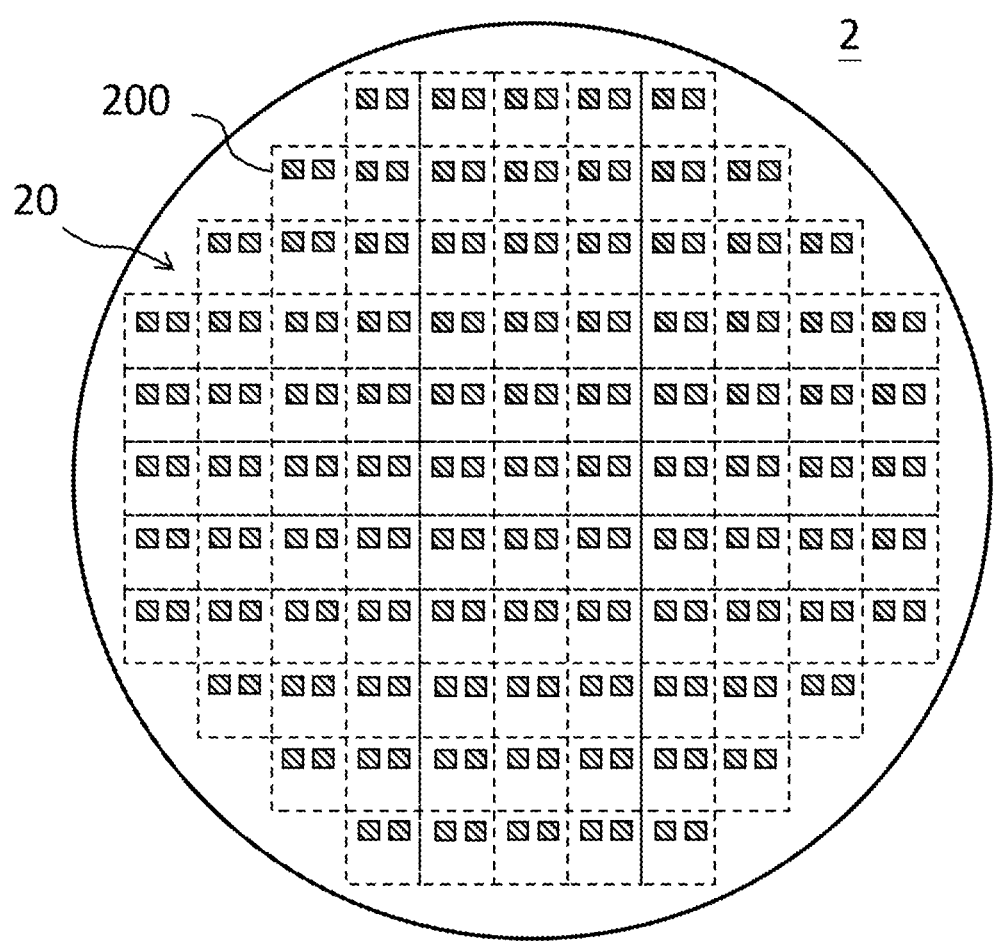
FIG. 2 is a top view of a wafer testing carrier in accordance with an embodiment of the present invention.
Figure 3A:
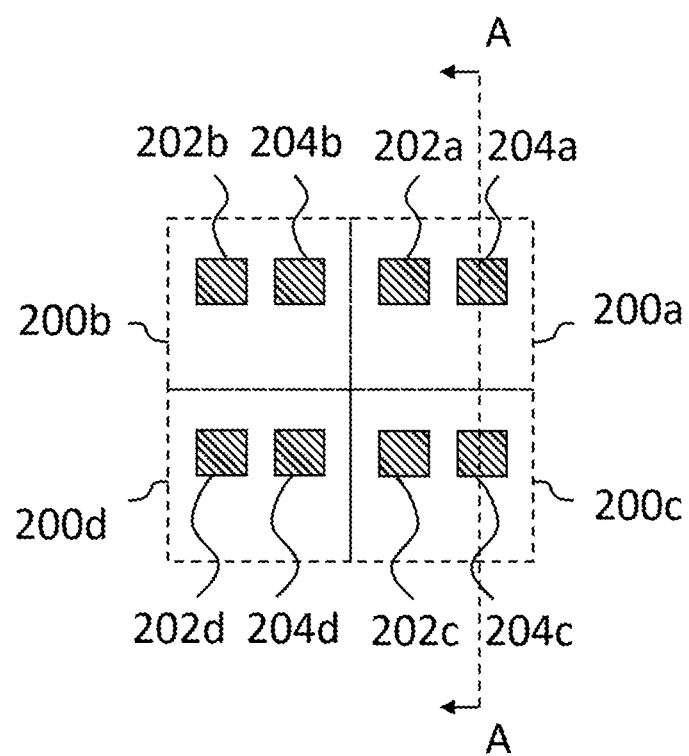
FIG. 3A is a top view of a portion of testing portions in accordance with an embodiment of the present invention.

For the sake of clearly describing the structure of the wafer testing carrier, the wafer testing carrier is illustrated in other figures. Please refer to FIG. 2 and FIG. 3A, wherein FIG. 2 is a top view of a wafer testing carrier in accordance with an embodiment of the present invention, and FIG. 3A is a top view of a portion of testing portions in accordance with an embodiment of the present invention. As shown in FIG. 2 and FIG. 3A, the wafer testing carrier 2 may have a first surface 20 having a plurality of testing portions 200. In one example, the wafer testing carrier 2 may be plate-shaped, disposed on the carrier stage. When carrying the wafer under test DUT, the first surface 20 of the wafer testing carrier 2 may face toward the lower surface of the wafer under test DUT, and the plurality of the testing portions 200 may correspond to a plurality of light emitting units. Practically, the wafer testing carrier 2 may be changed according to the wafer under test DUT. For example, different wafer testing carriers may be chosen for the wafer under test, or a new wafer testing carrier may be designed according to the wafer under test.

In one example, each testing portion 200 corresponds to one light emitting unit. Briefly speaking, if the plurality of the light emitting units on the wafer under test DUT are arranged according to a second matrix, then the plurality of the testing portions of the wafer testing carrier 2 will also be arranged according to the second matrix. The present invention does not limit a one-to-one corresponding relationship between the testing portion and the light emitting unit. In another example, the plurality of the testing portions may also only correspond to some light emitting units in one area for sampling some of the light emitting units rather than each light emitting unit on the wafer under test.

When the plurality of the testing portions 200 in the wafer testing carrier 2 are arranged according to the second matrix, for the sake of illustration, there are a testing portion 200a, a testing portion 200b, a testing portion 200c, and a testing portion 200d as shown in FIG. 3A, wherein the testing portion 200a and the testing portion 200b may be in the same row of the second matrix, the testing portion 200c and the testing portion 200d are in the same row of the second matrix, the testing portion 200a and the testing portion 200c are in the same column of the second matrix, and the testing portion 200b and the testing portion 200d are in the same column of the second matrix. Therefore, the testing portion 200a, the testing portion 200b, the testing portion 200c, and the testing portion 200d are arranged according to a 2×2 matrix.

Practically, the plurality of the testing portions 200 may be arranged according to many matrices. For example in FIG. 2, the plurality of the testing portions 200 may be divided into one 5×11 matrix, two 3×5 matrices, four 2×1 matrices and four 1×1 matrices; as long as the testing portions 200 in each matrix may correspond to the light emitting units on the wafer under test, it is within the scope of the present embodiment. In another perspective, the plurality of the testing portions 200 may not necessarily be arranged according to a matrix, they may also be arranged according to one or plurality of patterns. Likewise, as long as the testing portions 200 in the pattern may correspond to the light emitting units, it is within the scope of the present embodiment. It is worth mentioning that, even though a few of the testing portions 200 do not correspond to the light emitting units on the wafer under test, as long as such light testing portions not corresponding to the light emitting units will not cause malfunction or damage in the detection procedure, or as long as those light testing portions 200 not corresponding to the light emitting units may be simply bypassed, they are still simple variations within the scope of the present embodiment.

As shown in the testing portion 200a in FIG. 3A, the testing portion 200a may comprise a conductive element 202a (i.e. a first conductive element) and a conductive element 204a (i.e. a second conductive element). The conductive element 202a and the conductive element 204a may respectively correspond to the two contacting pads of the same light emitting unit on the wafer under test DUT. For example, the conductive element 202a may correspond to the cathode of the contacting pad, and the conductive element 204a may correspond to the anode of the contacting pad. Therefore, when the testing portion 200a is driven, a driving current may pass through the flexible conductive layer (not shown in FIG. 3A) through the testing portion 202a to the corresponding cathode of the light emitting unit, and the testing portion 204a may receive the driving current left from the anode of the light emitting unit through the flexible conductive layer, thereby forming a complete current circuit. The present embodiment only illustrates that the conductive element in the testing portion has a corresponding relationship to the contacting pad in the light emitting unit. However, the conductive element 202a may also correspond to the contacting pad of the anode, and the conductive element 204a may also correspond to the contacting pad of the cathode; as long as the testing portion corresponds to one light emitting unit, and the two conductive elements correspond to different contacting pads. The present embodiment does not restrict that the first conductive element and the second conductive element correspond to the cathode or the anode.

In one example, the first conductive elements of the testing portions in the same column are electrically connected with each other in the same matrix, and the second conductive elements of the testing portions in the same row are electrically connected with each other in the same matrix. In other words, as the testing portion 200a and the testing portion 200c are located in the same column of said second matrix, the conductive element 202a of the testing portion 200a and the conductive element 202c of the testing portion 200c may be electrically connected with each other. Also, as the testing portion 200a and the testing portion 200b are located in the same row of said second matrix, the conductive element 204a of the testing portion 200a and the conductive element 204b of the testing portion 200b may be electrically connected with each other. Likewise, the conductive element 202b of the testing portion 200b and the conductive element 202d of the testing portion 200d may be electrically connected with each other, and the conductive element 204c of the testing portion 200c and the conductive element 204d of the testing portion 200d may be electrically connected with each other.

Figure 3B:
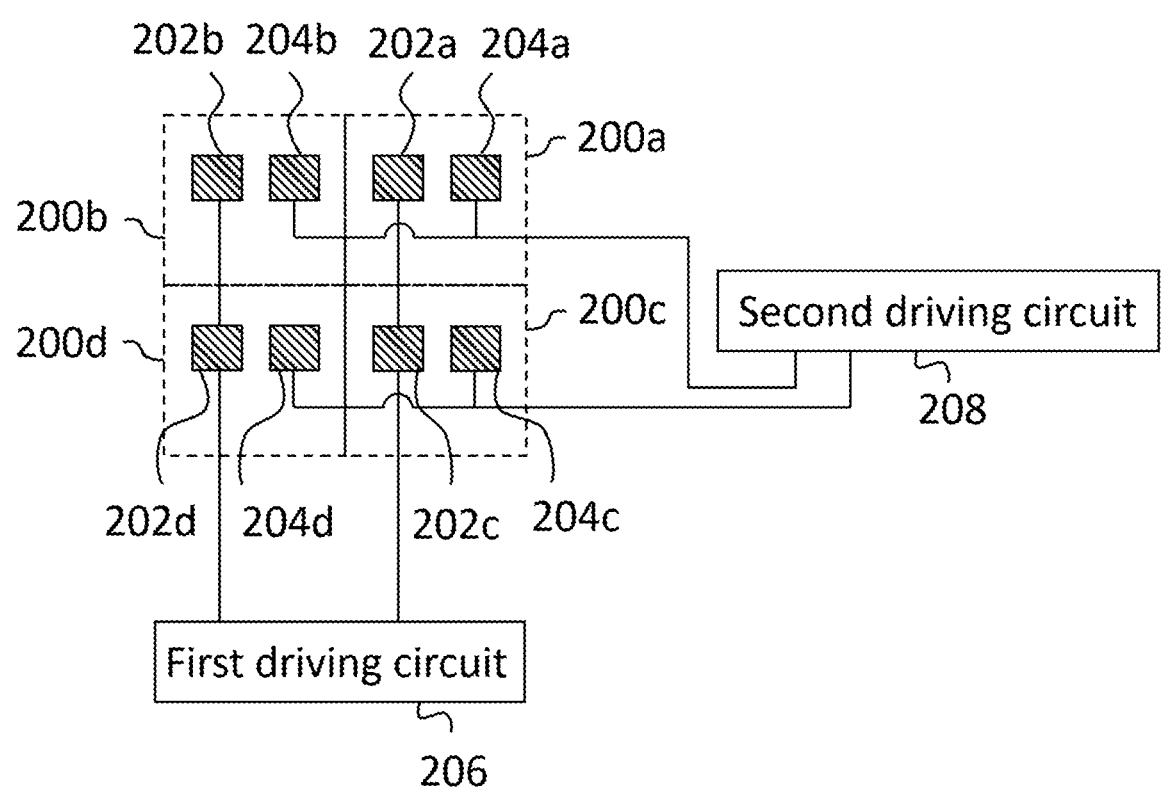
FIG. 3B is a functional block diagram of a portion of testing portions in accordance with an embodiment of the present invention.

In practice, in the detection procedure, the testing portion 200a, the testing portion 200b, the testing portion 200c, and the testing portion 200d may be driven following a certain sequence. For the sake of illustration, please refer to both FIG. 3A and FIG. 3B, wherein FIG. 3B is a functional block diagram of a portion of testing portions in accordance with an embodiment of the present invention. As shown in FIG. 3A and FIG. 3B, the wafer testing carrier 2 may further comprise a first driving circuit 206 and a second driving circuit 208. The first driving circuit 206 may comprise a plurality of first connecting ports (not shown), and each first connecting port may be electrically connected with one of the columns of the testing portions. The second driving circuit 208 may comprise a plurality of second connecting ports (not shown), and each second connecting port may be electrically connected with one of the rows of the testing portions.

In FIG. 3B for example, the first one of (or one of) the first connecting ports of the first driving circuit 206 may be connected with the testing portion 200*a* and the testing portion 200*c*, and especially be electrically connected with the conductive element 202*a* and the conductive element 202*c*; while the second one of (or another one of) the first connecting ports of the first driving circuit 206 may be connected with the testing portion 200*b* and the testing portion 200*d*, and especially be electrically connected with the conductive element 202*b* and the conductive element 202*d*. On the other hand, the first one of (or one of) the second connecting ports of the second driving circuit 208 may be connected with the testing portion 200*a* and the testing portion 200*b*, and especially be electrically connected with the conductive element 204*a* and the conductive element 204*b*; while the second one of (or another one of) the second connecting ports of the second driving circuit 208 may be connected with the testing portion 200*c* and the testing portion 200*d*, and especially be electrically connected with the conductive element 204*c* and the testing portion 204*d*.

The present embodiment does not restrict that whether the first driving circuit 206 and the second driving circuit 208 are disposed on the first surface 20. In one embodiment, the first driving circuit 206 and the second driving circuit 208 may be disposed on the first surface 20, to avoid hindering the wafer under test DUT being placed on the opposite site of the first surface 20 (i.e. the second surface). In addition, the first driving circuit 206 and the second driving circuit 208 may be two separate physical circuits, and practically they may be integrated in a same chip. In one example, if the wafer testing device of flip chip VCSEL further comprises the suction module 18 as shown in FIG. 1A, when the suction module 18 receives a sucking command to start sucking gas, then the wafer under test DUT will be sucked on the wafer testing carrier 2. In another example, an airtight structure (not shown) may be disposed on the first surface 20. For example, there may be a stable airtight between the flexible conductive layer 11 and the first surface 20. Thus, when the wafer under test DUT is placed on the flexible conductive layer 11 and the first surface 20, the suction module 18 may successfully suck the gas between the wafer under test DUT and the flexible conductive layer 11, forming a negative pressure environment and press the wafer under test DUT toward the flexible conductive layer 11 and the first surface 20.

In a practical operation example, when the wafer testing carrier 2 detects the light emitting unit corresponding to the testing portion 200*a*, first of all, it should be ensured that the light emitting unit corresponding to the testing portion 200*a* is placed on the correct location. In one example, the optical detecting module is fixed, and only the wafer testing carrier 2 may be moved in a horizontal direction by the horizontal moving module. Herein, according to a default coordinate parameter the processing module may output a moving command to control the horizontal moving module, such that the light emitting unit corresponding to the testing portion 200*a* may be moved to right below the light receiving portion of the optical detecting module. Then, the processing module may control the first driving circuit 206 to output a driving signal to the first one of the first connecting port, the conductive element 202*a* and the conductive element 202*c*. Also, the processing module may simultaneously control the second driving circuit 208 to output a driving signal to the first one of the second connecting port, the conductive element 204*a* and the conductive element 204*b*. Herein, as the conductive element 202*a* and the conductive element 204*a* are simultaneously in a conducting state, the light emitting unit corresponding to the testing portion 200*a* will then be driven to emit a light beam. After the light receiving portion of the optical detecting module receives the light beam emitted from the light emitting unit, it will output a detection result for the processing module to perform following evaluations. Herein, as the two conductive elements of other testing portions, such as the testing portion 200*c* or testing portion 200*b*, are not simultaneously conducted, the processing module will not incorrectly drive the light emitting units corresponding to the testing portion 200*c* or testing portion 200*b*, such that the detection result will not be interfered.

If the wafer testing carrier 2 is going to continue detecting the light emitting unit of the testing portion 200*b*, likewise, the processing module may output a moving command to control the horizontal moving module according to the default coordinate parameter, so that the light emitting unit corresponding to the testing portion 200*b* will be moved to right below the light receiving portion of the optical detecting module. A person having ordinary skill in the art may know that when the optical detecting module is kept unmoved and the wafer testing carrier 2 is only moved horizontally, then the distance from the optical detecting module to the light emitting unit shall also be kept the same, which may save the time to re-adjust the optical path accordingly. Then, the processing module may control the first driving circuit 206 to output a driving signal to the second one of the first connecting port, the conductive element 202*b* and the conductive element 202*d*, and the processing module may simultaneously control the second driving circuit 208 to output a driving signal to the first one of the second connecting port, the conductive element 204*a* and the conductive element 204*b*. Herein, as the conductive element 202*b* and the conductive element 204*b* are simultaneously in a conducting state, the light emitting unit corresponding to the testing portion 200*b* will then be driven to emit a light beam. Likewise, after the light receiving portion of the optical detecting module receives the light beam emitted from the light emitting unit, it will output a detection result for the processing module to perform following evaluations.

Figure 4:
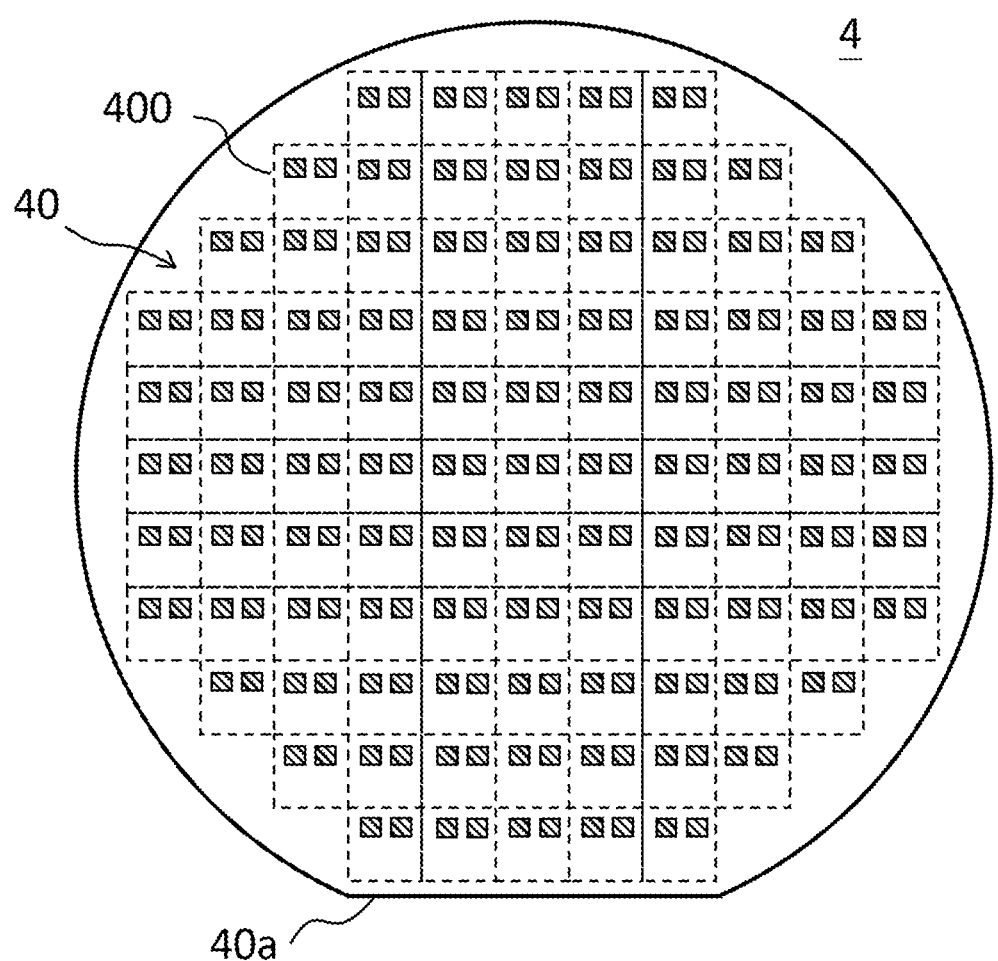
FIG. 4 is a top view of a wafer testing carrier in accordance with another embodiment of the present invention.

Moreover, to quickly ensure the light emitting unit corresponding to the testing port being at the correct location and to facilitate following evaluations, the wafer testing carrier further comprises a positioning portion. Please refer to FIG. 4, a top view of a wafer testing carrier in accordance with another embodiment of the present invention. As shown in FIG. 4, similar to the previous embodiment, the wafer testing carrier 4 in the present embodiment also has a first surface 40 (e.g. the surface viewed from FIG. 4), and the first surface 40 comprises a plurality of testing portions 400. Different from the previous embodiment, the first surface 40 may further comprise a positioning portion 40*a*. The positioning portion 40*a* has a unique appearance, and such appearance is related to a positioning structure of the wafer under test DUT. In practice, when the manufacture of the wafer under test DUT is completed, a notch is usually sliced out on the wafer under test DUT beforehand, and such notch is the positioning structure of the wafer under test DUT. The appearance of the positioning portion 40*a* of the first surface 40 may be similar to the positioning structure of the wafer under test DUT, such that the positioning structure of the wafer under test DUT may be aligned to the positioning portion 40*a*, thereby expediting placing the wafer under test DUT to the correct location on the first surface 40*a*. The present embodiment does not limit the quantity of the positioning portion 40a. If there are multiple positioning structures designed beforehand on the wafer under test DUT, then there also may be corresponding quantity of the positioning portions 40a designed on the wafer testing carrier 4. In addition, the present embodiment does not limit the appearance of the positioning portion 40a. As long as the appearance of the positioning portion 40a may facilitate the accurate alignment to the positioning structure of the wafer under test DUT, it should fall within the scope of the positioning portion 40a in the present embodiment. In one example, the flexible conductive layer (not shown in FIG. 4) disposed on the first surface 40 may also comprise a positioning portion. As the flexible conductive layer may align to the correct location on the first surface 40 beforehand, the wafer under test DUT may also be quickly positioned to the correct location through the positioning portion on the flexible conductive layer.

Figure 5A:
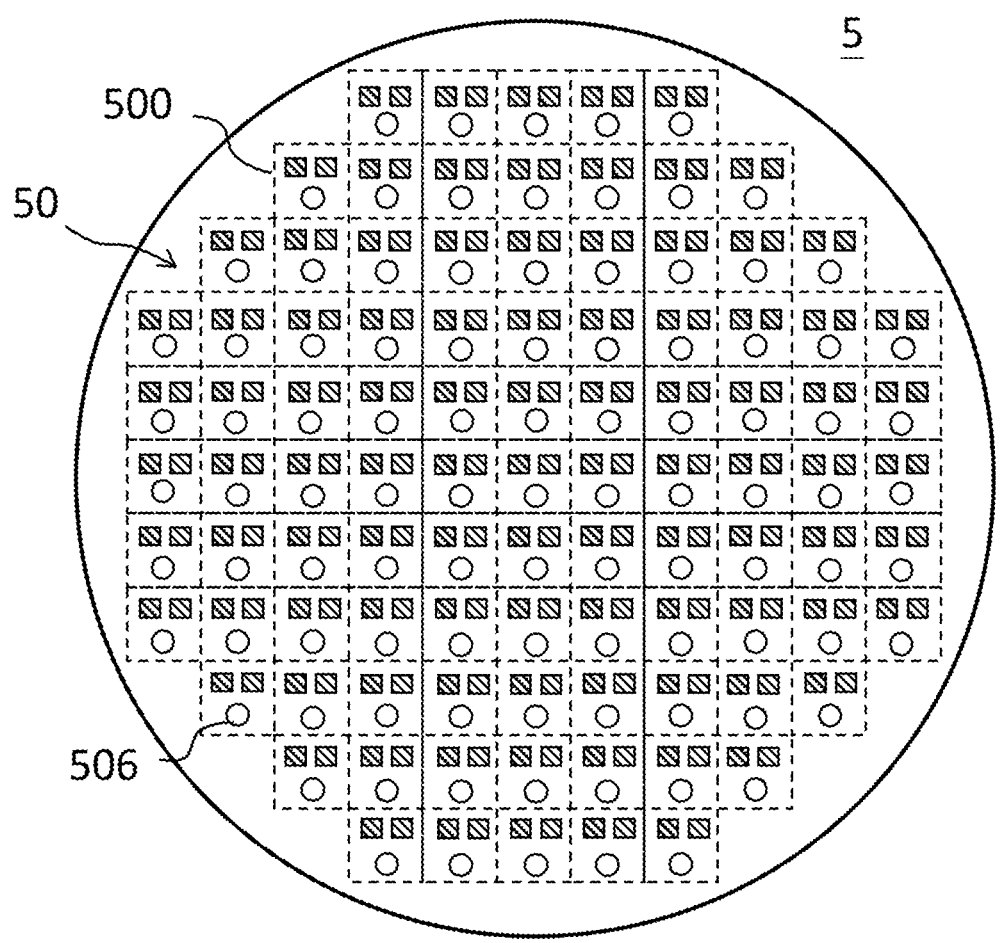
FIG. 5A is a top view of a wafer testing carrier in accordance with another embodiment of the present invention.
Figure 5B:
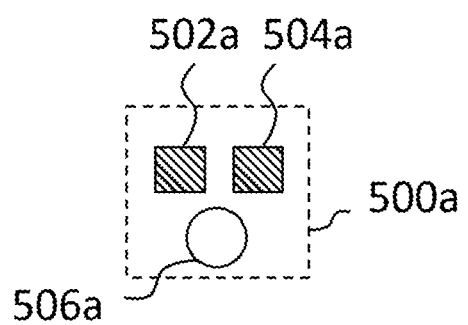
FIG. 5B is a top view of a portion of testing portions in accordance with the embodiment in FIG. 5A.

In addition, to make the suction module more efficiently suck gas, in one example, the first surface of the wafer testing carrier may comprise one or more than one suction hole(s). FIG. 5A is a top view of a wafer testing carrier in accordance with another embodiment of the present invention, and FIG. 5B is a top view of a portion of testing portions in accordance the embodiment in FIG. 5A. As shown in FIG. 5A and FIG. 5B, similar to the previous embodiment, the wafer testing carrier 5 also has a first surface 50 (e.g. the surface viewed from FIG. 5A), and the first surface 50 comprises a plurality of testing portions 500, wherein the testing portions 500 may be arranged according to a second matrix or a first pattern. Different from the previous embodiment, the first surface 50 further comprises a plurality of suction holes 506. The suction holes 506 may be arranged according to a first matrix or a second pattern, and one end of the suction hole 506 is exposed to the first surface 50.

Practically, the quantity of the suction holes 506 may be the same as the quantity of the testing portions 500. That is, a suction hole 506 may be correspondingly configured in each testing portion 500. As shown in the example of FIG. 5B, any of the testing portion 500a on the first surface 50 may comprise a conductive element 502a and a conductive element 504, and may further comprise an suction hole 506a. Accordingly, the second matrix shall be same as to the first matrix, and the first pattern shall be similar to the second pattern. As the suction hole 506 is in the testing portion 500, the length and width (or area) of the second pattern may be slightly smaller than the first pattern.

The present embodiment does not restrict the suction hole 506a to be located inside the testing portion 500a or the appearance of the suction hole 506a. In one example, the suction hole 506a may be symmetric to the conductive element 502a and the conductive element 504a; that is, a center of the suction hole 506a may be located at the symmetrical midline of the conductive element 502a and conductive element 504a. Such advantage is that it may suck gas more uniformly and let the contacting pads evenly press on the conductive element 502a and conductive element 504a through the flexible conductive layer, avoiding the pressure being locally concentrated at one of the conductive elements. Besides, the appearance of the suction hole 506a exposed to the first surface may be a circle, a rectangle or with other appropriate shape, which is not limited in the present embodiment. Practically, one end of the opening of the suction hole 506a is on the first surface 50, whereas the other end is connected with the suction module. Herein, the present embodiment does not restrict that the other end of the opening of the suction hole 506a is on which surface of the wafer testing carrier 5. For example, the other end of the opening of the suction hole 506a may be located on the second surface of the wafer testing carrier 5, and the second surface may just be the revised side of the first surface. Thus, the suction hole 506a may be a via connecting up and down and is connected with the suction module through the second surface of the wafer testing carrier 5. For another example, the other end of opening of the suction hole 506a may be on one side surface of the wafer testing carrier 5, and said side surface is not said first surface or said second surface. Therefore, the suction hole 506a may vertically get into the wafer testing carrier 5 from the first surface 50, whereas being a horizontal type via in the inner side of the wafer testing carrier 5 and connected with the suction module through the side surface of the wafer testing carrier 5.

Also, the suction holes 506 may be respectively connected with the suction module, or several suction holes 506 are connected with each other in the wafer testing carrier 5, integrating an opening connected with the suction module, which is not limited in the present embodiment. Furthermore, the present embodiment also does not restrict the area of each suction hole 506 being exposed to the first surface. For example, the portion of the area of the suction hole 506a of the testing portion 500a that is in the first surface may generally be the same as the portion of the area that the conductive element 502a or conductive element 504a is in the first surface.

Figure 6:
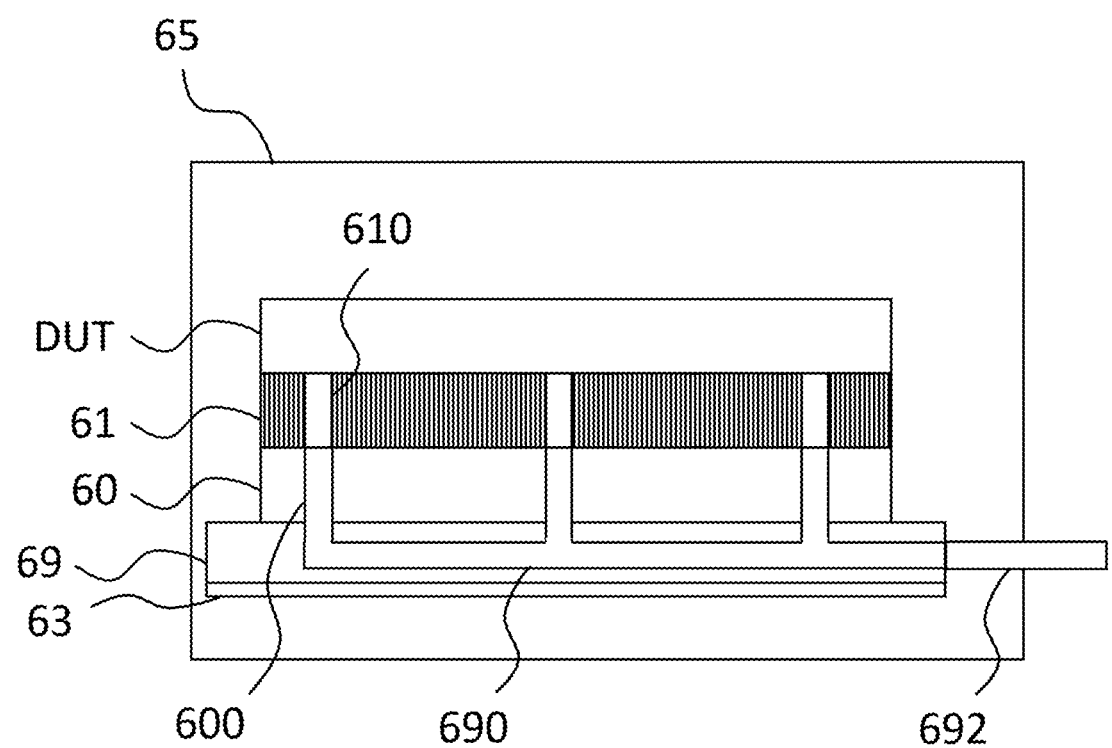
FIG. 6 is a framework diagram of a wafer testing device of flip chip VCSEL in accordance with another embodiment of the present invention.

To further clearly illustrate how the wafer under test DUT is sucked on the wafer testing carrier, please refer to FIG. 6. a framework diagram of a wafer testing device of flip chip VCSEL in accordance with another embodiment of the present invention. As shown in FIG. 6, suppose the wafer under test DUT, the wafer testing carrier 60, the flexible conductive layer 61, the temperature controlling unit 63, and the carrier stage 69 are all configured in the accommodation space inside the vacuum chamber 65, and that the flexible conductive layer 61 and the temperature controlling unit 63 are configured on the two sides of the wafer testing carrier 60 respectively. Specifically, the wafer under test DUT is placed on the flexible conductive layer 61, the flexible conductive layer 61 is placed on the wafer testing carrier 60, and the wafer testing carrier 60 is placed on the carrier stage 69; therefore, the wafer under test DUT, the flexible conductive layer 61, the wafer testing carrier 60, and the carrier stage 69 are of a sequentially packed construction. Herein, the wafer testing carrier 60 may comprise a plurality of connective suction holes 600, and the flexible conductive layer 61 may also comprise a plurality of vias 610, wherein each of suction hole 600 may correspond to one via 610. In other words, the arrangement of the suction holes 600 are generally the same as the arrangement of the vias 610 (for example, both arrangements are according to the second pattern). As mentioned earlier, the suction holes 600 may vertically pass the wafer testing carrier 60 and correspond to a suction pipe 690 on the carrier stage 69. The suction pipe 690 inside the carrier stage 69 may be extended horizontally, be exposed to a side surface of the carrier stage 69, and then be connected through another pipe 692 to a suction module (not shown) outside of the vacuum chamber 65. The upper side surface of the vacuum chamber 65 may be close to the light emitting surface of the wafer under test DUT, wherein said upper side surface may consist of transparent materials. Accordingly, in the course of detecting the wafer under test DUT, the light beams emitted from the light emitting units on the wafer under test DUT may penetrate to the vacuum chamber 65. Also, said optical detecting module may be disposed above the vacuum chamber 65 to detect the light beams emitted from the light emitting units.

Figure 7:
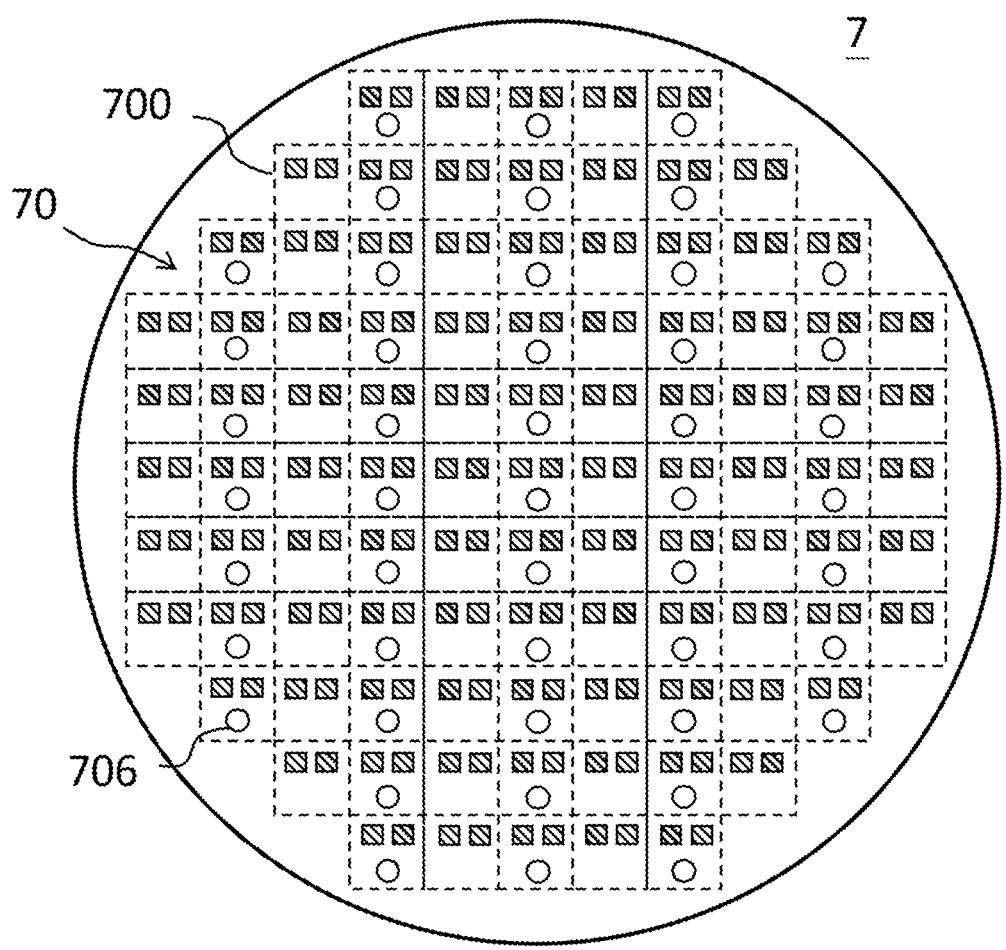
FIG. 7 is a top view of a wafer testing carrier in accordance with another embodiment of the present invention.

Back to FIG. 5A, FIG. 5A illustrates that the quantity of the suction holes 506 may be the same as the quantity of the testing portions 500 and that each testing portion 500 may correspond to one suction hole 506; however, practically as long as the efficiency of the suction module is good and for the sake of the structural strength of the wafer testing carrier 5, the quantity of the suction holes may also be fewer than the quantity of the testing portions. Please refer to both FIG. 5A and FIG. 7, wherein FIG. 7 is a top view of a wafer testing carrier in accordance with another embodiment of the present invention. As shown in FIG. 5A and FIG. 7, similar to the previous embodiment, the wafer testing carrier 7 in the present embodiment may also have a first surface 70 (e.g. the surface viewed from FIG. 7), and a plurality of testing portions 700 may be disposed on the first surface, wherein the plurality of the testing portions 700 may be arranged according to a second matrix or a first pattern. The first surface 70 may also comprise a plurality of suction holes 706, and the suction holes 706 may be arranged according to a first matrix or a second pattern. Different from the previous embodiment, the suction holes 706 on the first surface 70 are fewer. That is, not each testing portion 700 has one corresponding suction hole 706; instead, the suction holes 706 are configured in a column intervene between the testing portions 700. As such, the second matrix shall be larger than the first matrix, and the area of the first pattern shall be larger than the area of the second pattern.

Figure 8:
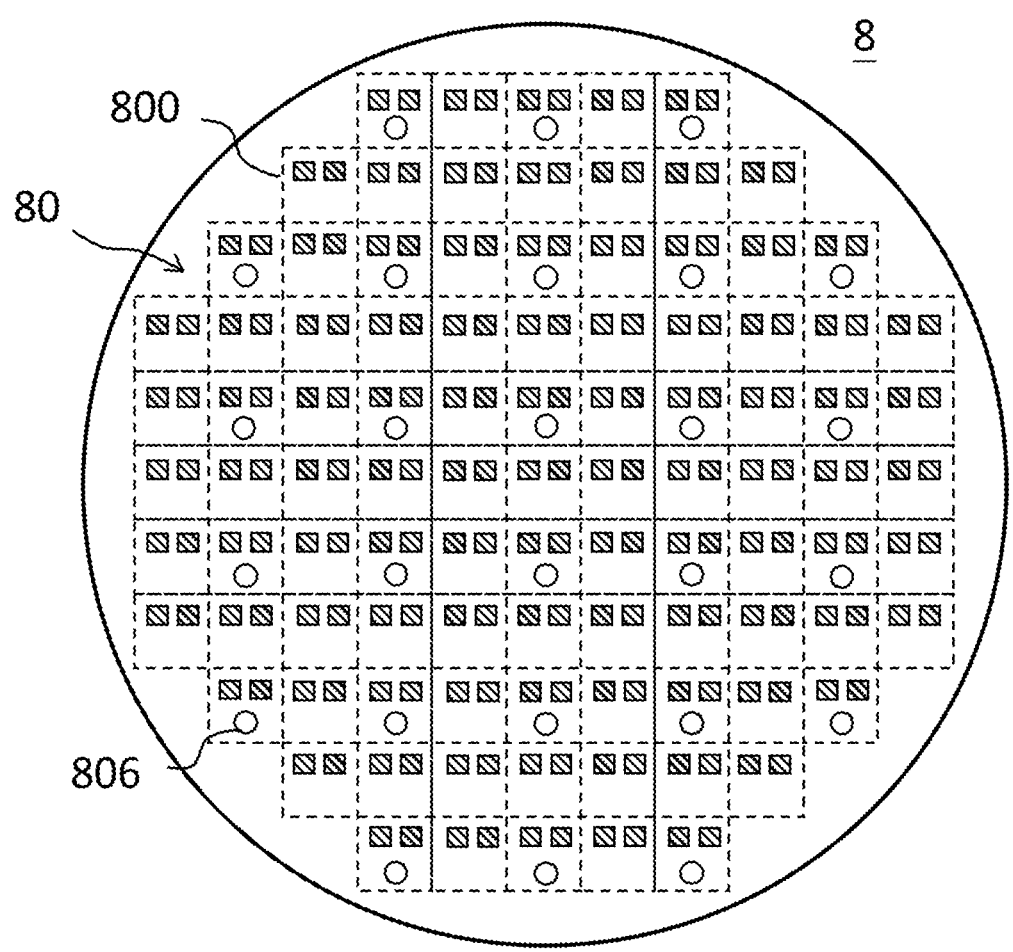
FIG. 8 is a top view of a wafer testing carrier in accordance with another embodiment of the present invention.

The present embodiment does not restrict the quantity of the suction holes. Please refer to FIG. 7 and FIG. 8, wherein FIG. 8 is a top view of a wafer testing carrier in accordance with another embodiment of the present invention. As shown in FIG. 7 and FIG. 8, similar to the previous embodiment, the wafer testing carrier 8 has a first surface 80 (e.g. the surface viewed from FIG. 8). A plurality of testing portions 800 are disposed on the first surface and the testing portions 800 may be arranged according to a second matrix or a first pattern. The first surface 80 also comprises a plurality of suction holes 806 which may be arranged according to a first matrix or a second pattern. Different from the previous embodiment, the quantity of the suction holes 806 on the first surface 80 are much fewer, and the suction holes 806 are configured in a column intervene and a row intervene between the testing portions 800. Certainly, the second matrix shall be larger than the first matrix, and the area of the first pattern shall be larger than the area of the second pattern.

Practically, the suction holes as shown in FIG. 5A, FIG. 7, or FIG. 8 may be disposed within the peripheral of the first surface. In addition, to maintain better suction efficiency, when the wafer under test DUT is placed on the first surface, the wafer under test DUT is supposed to cover those suction holes, such that when the suction module starts to suck gas, each suction hole may exert its gas suction function between the wafer under test DUT and the first surface. Moreover, at least a first distance is between each suction hole and the adjacent first conductive element or second conductive element, and at least a second distance is between each suction hole and another adjacent suction hole, wherein the first distance is smaller than or equal to the second distance. For example in FIG. 5A and FIG. 5B, the distances from the conductive element 502a and the conductive element 504a to the suction hole 506a are generally the same, which is defined as the first distance, whereas the distance between the adjacent suction holes 506 is defined as the second distance. Practically, the second distance may be larger than the first distance. For a clearer example as shown in FIG. 8, at least a distance of a whole testing portion 800 is between the adjacent suction holes 806, and apparently such distance is larger than the distance from the conductive element to the suction hole of the same testing portion 800.

In one example, if the dies on the wafer under test DUT are smaller, then the corresponding size of the testing portion 800 shall be smaller as well. Herein, the first distance may be in the range of 0.2~0.4 mm, and practically the difference between the second distance and the first distance may be larger. Suppose the first distance is 0.25 mm, for the sake of the structural strength and the efficiency of gas suction and cooling, the second distance may be two times of the first distance, i.e. 0.5 mm. In another example, if the dies on the wafer under test DUT are larger, then the corresponding size of the testing portion 800 will be larger. Herein, the first distance may be in the range of 0.5~20 mm, and practically the difference between the second distance and the first distance may be smaller. Suppose the first distance is 0.5 mm, for the sake of the structural strength and the efficiency of gas suction and cooling, the second distance may just be the first distance, i.e. 0.5 mm.

In one example, there is a third distance between the suction hole and the peripheral of the first surface, and the first distance is smaller than or equal to the third distance. In FIG. 8 for example, the distance from the suction hole 806 to the peripheral of the first distance 80 is defined as the third distance. Such third distance shall be larger than or equal to the distance from the conductive element to the suction hole of the same testing portion 800. Accordingly, it can avoid issues, such as the suction hole 806 leaking gas or the structural strength of the first surface 80 being insufficient, which may be caused by the peripheral of the first surface 80 being too near to the suction hole 806.

In summary, the wafer testing device of flip chip VCSEL provided in the present invention may allow massive and direct detection of dies on the wafer under test without contacting the light emitting surface of the wafer under test. Moreover, the wafer testing device of flip chip VCSEL provided in the present invention comprises the flexible conductive layer, and the light emitting units may be electrically connected with the testing portions through the flexible conductive layer, thereby overcoming issues of poor contact. Furthermore, the temperature controlling unit device provided in the present invention may allow the wafer under test on the wafer testing carrier to operate at a given temperature.

What is claimed is:

1. A wafer testing device of flip chip vertical cavity surface emitting laser (VCSEL) for testing a wafer under test having a plurality of light emitting units, the wafer testing device of flip chip VCSEL comprising:
    a wafer testing carrier having a first surface, wherein a plurality of testing portions are disposed on the first surface; and
    a flexible conductive layer, detachably disposed on the first surface, wherein the flexible conductive layer is conductive in a vertical direction and insulated in a horizontal direction;
    wherein the wafer under test is disposed on the flexible conductive layer, and each light emitting unit is electrically connected with one of the testing portions in the vertical direction through the flexible conductive layer while testing the wafer under test;

wherein the wafer testing carrier further comprises a plurality of suction holes arranged according to a first matrix, and one end of the suction holes is exposed to the first surface;
wherein the flexible conductive layer comprises a plurality of vias arranged according to the first matrix, and each via corresponds to one of the suction holes.

2. The wafer testing device of flip chip VCSEL according to claim 1, wherein each testing portion has a first conductive element and a second conductive element, and the testing portions are arranged according to a second matrix, wherein in the testing portions that are in the same columns of the second matrix, the first conductive elements of the adjacent testing portions are electrically connected, and in the testing portions that are in the same rows of the second matrix, the second conductive elements of the adjacent testing portions are electrically connected.

3. The wafer testing device of flip chip VCSEL according to claim 2, wherein each testing portion corresponds to one of the light emitting units, and the first conductive element of each testing portion is electrically connected with a first contacting pad of the corresponding light emitting unit through the flexible conductive layer, while the second conductive element of each testing portion is electrically connected with a second contacting pad of the corresponding light emitting unit through the flexible conductive layer.

4. The wafer testing device of flip chip VCSEL according to claim 1, further comprising a suction module, wherein the suction module is connected with the suction holes and sucks gas through the suction holes according to a sucking command.

5. The wafer testing device of flip chip VCSEL according to claim 4, further comprising a vacuum chamber and a compressing module, wherein at least the wafer testing carrier and the flexible conductive layer are disposed in an accommodation space of the vacuum chamber, and the compressing module is configured to add pressure to the accommodation space to make the pressure in the accommodation space larger than 1 atm.

6. The wafer testing device of flip chip VCSEL according to claim 1, further comprising a temperature controlling unit, wherein the temperature controlling unit is adjacent to a second surface of the wafer testing carrier with the second surface being opposite to the first surface, and the temperature controlling unit is configured to increase or decrease the temperature of the wafer testing carrier.

7. The wafer testing device of flip chip VCSEL according to claim 1, further comprising:
an optical detecting module, having a light receiving portion to receive a light beam and generate a detection result;
a horizontal moving module, subject to a moving command to move the wafer testing carrier and making one of the testing portions align with the light receiving portion of the optical detecting module; and
a processing module, electrically connected with the wafer testing carrier, the optical detecting module, and the horizontal moving module, to execute a detecting procedure for generating the moving command and receiving the detection result.

8. The wafer testing device of flip chip VCSEL according to claim 1, wherein a non-light emitting surface of the wafer under test contacts the flexible conductive layer while testing the wafer under test.

9. A wafer testing device of flip chip vertical cavity surface emitting laser (VCSEL) for testing a wafer under test having a plurality of light emitting units, the wafer testing device of flip chip VCSEL comprising:
a wafer testing carrier, having a first surface and a plurality of suction holes with one end of each suction hole being exposed to the first surface, wherein a plurality of testing portions are disposed on the first surface, and each testing portion comprises a first conductive element and a second conductive element, wherein the testing portions are arranged according to a first pattern, and the suction holes are arranged according to a second pattern; and
a flexible conductive layer, detachably disposed on the first surface, wherein the flexible conductive layer is conductive in a vertical direction and insulated in a horizontal direction;
wherein the flexible conductive layer comprises a plurality of vias arranged according to the second pattern, and each via corresponds to one of the suction holes;
wherein at least a first distance is between each suction hole and the adjacent first conductive element or the second conductive element, and at least a second distance is between each suction hole and the other adjacent suction hole, with the first distance being smaller than or equal to the second distance;
wherein a center of one of the plurality of suction holes is located at a symmetrical midline of the first conductive element and the second conductive element.

10. The wafer testing device of flip chip VCSEL according to claim 9, wherein the suction holes are disposed within the peripheral of the first surface, and a third distance is between the suction holes and the peripheral of the first surface, with the first distance being smaller than or equal to the third distance.

11. The wafer testing device of flip chip VCSEL according to claim 9, wherein the wafer under test is disposed on the flexible conductive layer which contacts a non-light emitting surface of the wafer under test, and the suction holes are disposed correspondingly within the peripheral of the non-light emitting surface while testing the wafer under test.

12. The wafer testing device of flip chip VCSEL according to claim 9, wherein the first pattern is a second matrix, and in the testing portions that are in the same columns of the second matrix, the first conductive elements of the adjacent testing portions are electrically connected, while in the testing portions that are in the same rows of the second matrix, the second conductive elements of the adjacent testing portions are electrically connected.

13. The wafer testing device of flip chip VCSEL according to claim 9, further comprising a temperature controlling unit, wherein the temperature controlling unit is adjacent to a second surface of the wafer testing carrier with the second surface being opposite to the first surface, and the temperature controlling unit is configured to increase or decrease the temperature of the wafer testing carrier.

* * * * *